United States Patent [19]

Mangelsdorf

[11] Patent Number: 5,412,385
[45] Date of Patent: May 2, 1995

[54] ERROR CORRECTION TESTING SYSTEM AND METHOD FOR A MULTISTAGE A/D CONVERTER

[75] Inventor: Christopher W. Mangelsdorf, Reading, Mass.

[73] Assignee: Analog Devices, Inc., Norwood, Mass.

[21] Appl. No.: 20,559

[22] Filed: Feb. 22, 1993

[51] Int. Cl.6 .................................................. H03M 1/10
[52] U.S. Cl. ........................................ 341/120; 341/156
[58] Field of Search ............... 341/120, 121, 155, 156, 341/158, 159

[56] References Cited

U.S. PATENT DOCUMENTS

| | | | |
|---|---|---|---|
| 4,535,319 | 8/1989 | Penney | 341/156 |
| 4,903,024 | 2/1990 | Evans et al. | 341/120 |
| 4,947,106 | 8/1990 | Chism | 341/120 |
| 5,043,732 | 8/1991 | Robertson et al. | 341/156 |

*Primary Examiner*—Howard L. Williams
*Attorney, Agent, or Firm*—Iandiorio & Teska

[57] ABSTRACT

An error correction testing system and method for a multistage A/D converter includes a testing device for disabling the correction circuit and indicating the code transitions of the first A/D converter relative to the code transitions of the second A/D converter representing error in the first A/D converter.

6 Claims, 8 Drawing Sheets

MID-TREAD ENCODING

ERROR CORRECTION TESTING SYSTEM AND METHOD FOR A MULTISTAGE A/D CONVERTER

FIELD OF INVENTION

This invention relates to an improved error correction testing system for a multistage A/D converter.

BACKGROUND OF INVENTION

Conventional flash A/D converters employ a number of resistors, comparators equal to the desired resolution: an 8 bit A/D flash converter requires 256 resistors, and 255 comparators. This makes for a large and expensive component. To avoid this a two-stage or multistage converter system is used in which a first flash A/D converter digitizes the analog input signal, $A_{in}$, to a four-bit level, for example. This four-bit digitization is then processed through a D/A converter to obtain the analog value of the digitized signal and this analog signal is subtracted from the original analog input signal $A_{in}$. The result of this subtraction, known as the quantization error or residue, represents the error due to the coarseness of the first digitization step. This residue is then submitted to a second (four-bit for example) A/D flash converter where it is digitized to obtain the higher resolution. Typically an amplifier is used to provide the necessary gain to insure that the four bit output from the second flash converter is equal to one bit of the first flash converter. Finally, the four bits from the first converter and the four bits from the second converter provide the four MSBs and four LSBs, respectively, of the eight-bit output code.

One problem in such systems is that the residue range values vary with comparator offset errors in the first flash converter. Sometimes the residue signal will be less, and sometimes more, than the full range of the second A/D flash converter. It is standard procedure to include additional over- and under-range capacity in the second A/D flash converter to accommodate these excursions. In that case the four-bit outputs from each flash converter cannot be combined directly but must be processed by a logic circuit to obtain the final output code. This compensation for the first flash converter is known as digital error correction.

Even in systems having such digital error corrections an additional problem occurs. When the system is being tested it is not apparent just where in the range of the second flash converter the system is operating. If it is operating in the normal range or just barely in the overor under-correction range the system can be relied on for satisfactory performance. But if the system is operating at the extreme end of either the over- or under-correction range, then a failure may well occur as soon as the system is installed by a customer in an environment where the voltage, temperature, or some other condition causes the system to go beyond even its over- or under-range correction capacity. Further, often it is desired for purposes of economics and complexity to eliminate the sample and hold circuit which typically precedes the first flash converter. When this is so, the analog input can change during the conversion, adding to offset errors introduced by the first converter and increase the chances that the system may exceed even its over- and under-correction range in its final installation.

SUMMARY OF INVENTION

It is therefore an object of this invention to provide an improved error correction testing system and method for a multistage A/D converter.

It is a further object of this invention to provide such an improved error correction testing system and method for a multistage A/D converter which indicates potential failures even in converters that meet test specifications.

It is a further object of this invention to provide such an improved error correction testing system and method for a multistage A/D converter which indicates where in the over or under-correction range the converter is operating.

It is a further object of this invention to provide such an improved error correction testing system and method for a multistage A/D converter which indicates whether the correction range is more or less than needed.

It is a further object of this invention to provide such an improved error correction testing system and method for a multistage A/D converter which also accommodates for errors caused by changes in the analog input during a conversion cycle.

It is a further object of this invention to provide such an improved error correction testing system and method for a multistage A/D converter which can be used to evaluate the error in the first stage A/D.

The invention results from the realization that a truly revealing error correction testing system and method for a multistage A/D converter can be achieved by disabling the correction circuit that enables the second or subsequent stage or stages of a multistage A/D converter to correct for the errors introduced by the first or prior A/D converter and expose the relative position of the code transitions of the two A/D converters to detect and determine whether the second converter is operating in the correction range and, if so, how far and which one: the over or under.

This invention features an error correction testing system for a multistage A/D converter including a first A/D converter responsive to an analog input signal to provide a coarse digital output signal, and a digital to analog converter responsive to the coarse digital output signal to provide a coarse intermediate analog output signal. There are means for subtracting the analog input signal and the coarse intermediate output signal to obtain a residue signal having a predetermined ideal range. A second A/D converter has a fine digital output signal and has an added range beyond its nominal range for accommodating the residue signal going beyond its predetermined ideal range as a function of an error in the A/D converter. Correction means combine the coarse and fine digital output signals for enabling the second A/D converter to compensate using its added range for transition errors in the coding levels of the first A/D converter and produce a composite high-resolution output signal. Testing means disable the correction means and indicate the code transitions of the first A/D converter relative to the code transitions of the second A/D converter representing the error in the first A/D converter.

In a preferred embodiment the testing means may include switching means for disabling the correction means. The testing means may include means for displaying the code transitions of the first and second A/D converters. The testing means may also include means for detecting the relative positions of the code transitions of the first and second A/D converters or the positions of the coded transitions of the first A/D converter alone. There may also be included means for applying a test input to the second A/D converter for driving it at least to the end of its added range.

This invention also features a method of testing for error correction in a multistage A/D converter by submitting an analog input signal to a first A/D converter to provide a coarse digital output signal and delivering that coarse digital output signal to a D/A converter to obtain a coarse intermediate analog output signal. The analog input signal and coarse intermediate analog output signal are subtracted to produce a residue signal having a predetermined ideal range. The residue signal is submitted to a second A/D converter which provides a fine digital output signal and has a nominal range and an added range for accommodating for the residue signal going beyond its ideal range as a function of an error in the first A/D converter. The coarse and fine digital output signals are combined in a correction circuit for enabling the second A/D converter to compensate, using its added range, for transition errors in the coding levels of the first A/D converter and providing a composite high resolution output signal. The correction circuit is disabled to indicate the code transitions of the first A/D converter relative to the code transitions of the second A/D converter representing error in the first A/D converter.

DISCLOSURE OF PREFERRED EMBODIMENT

Other objects, features and advantages will occur to those skilled in the art from the following description of a preferred embodiment and the accompanying drawings, in which.

Figure 1:
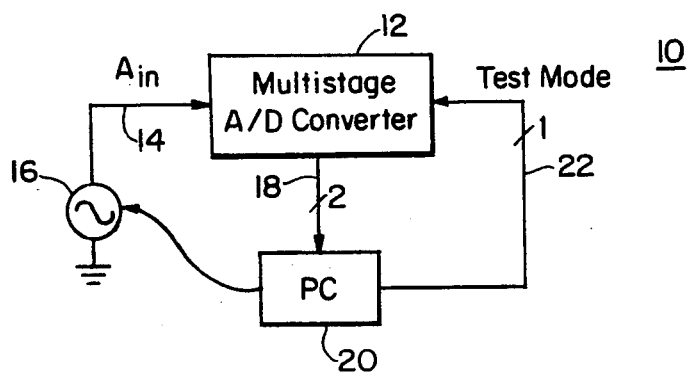
FIG. 1 is a schematic block diagram of an error correction testing system for a multistage A/D converter according to this invention.
Figure 2:
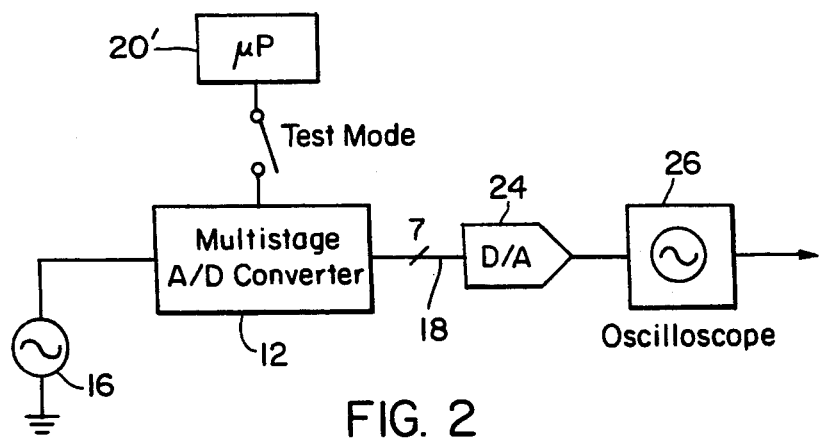
FIG. 2 is a schematic block diagram of an alternative error correction testing system for a multistage A/D converter according to this invention.

There is shown in FIG. 1 an error correction testing system for a multistage A/D converter 10 which includes a multistage A/D converter 12 under test which receives an analog test input on line 14 from signal generator 16. The output of A/D converter 12 is sensed on line 18 by microprocessor or PC 20, and the test commands are delivered on line 22. Alternatively, FIG. 2, the multistage A/D converter 12 under test may have its output on line 18 delivered through digital to analog converter 24 to an oscilloscope 26 or other display device where the test outputs can be viewed by a human operator. In such a case the test sequence may be controlled by computer or microprocessor 20' or a similar control device.

Figure 3:
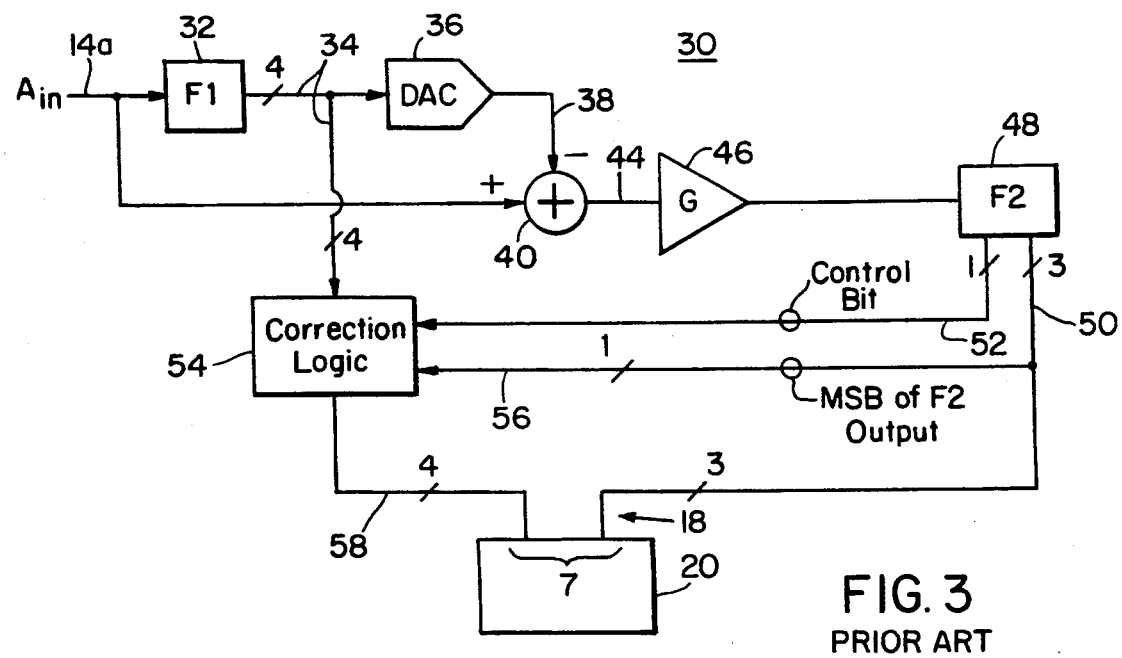
FIG. 3 is a schematic block diagram of a prior art error correction system for a multistage A/D converter.

In prior art devices a conventional multistage A/D converter with error correction 30, FIG. 3, receives an analog input on line 14a which is delivered to an A/D flash converter 32. A/D flash converter 32 produces a four bit coarse digital output signal on line 34 to D/A converter 36, which in turn provides an intermediate analog output signal on line 38 to summer 40. The other signal to summer 40 is the analog input signal on line 14a which is delivered on line 140 to summer 40. The two signals are subtracted. Typically the intermediate analog signal on line 38 is subtracted from the analog input signal on line 14a to produce the residue signal on line 44. This is submitted to amplifier 46, which amplifies the residue signal so that it occupies the full range of the second analog to digital flash converter 48. The output from second converter 48 is delivered on two sets of lines. Three bits of the LSBs, least significant bits, are provided on line 50 to the output device such as computer 20. The other line 52 contains an additional control bit which is delivered to correction logic 54. The most significant bit of the three bits on line 50 is also delivered on line 56 to correction logic 54. Depending upon the control bit on line 52 and the most significant bit on line 56, correction logic 54 determines whether to increment or decrement the four-bit signal on line 34 for delivery on four-bit line 58 to computer 20. In this manner the four most significant bits from converter 32 are combined with the three least significant bits supplied by converter 48 to provide a seven-bit, high resolution, output using two lower resolution four-bit converters 32 and 48, respectively, as is well known in the art. Actually converter 48 in this instance is a four-bit converter: three are applied to the resolution of the analog input signal and one is used as a control bit.

Figure 4:
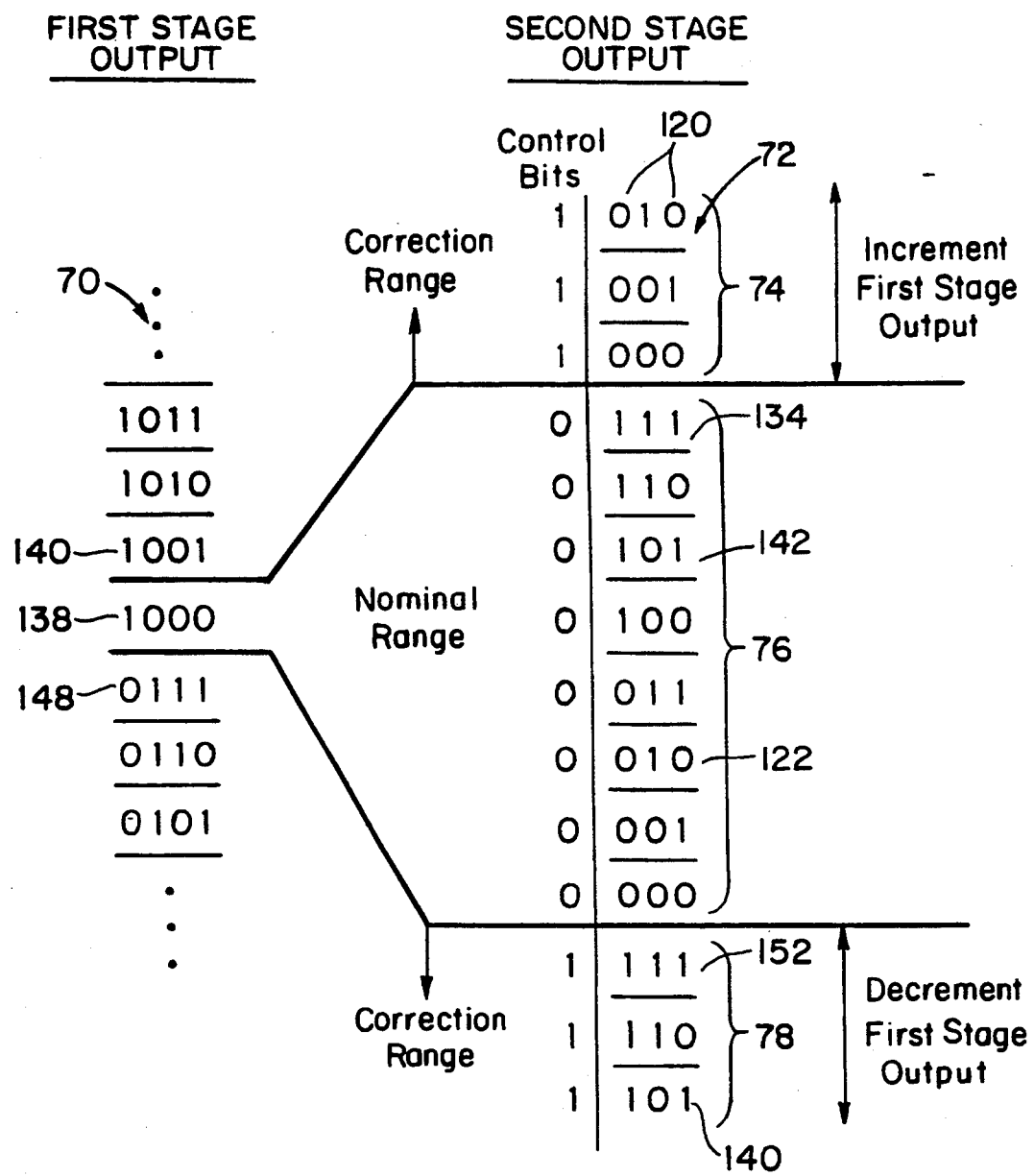
FIG. 4 is an illustration of the encoding scheme used in the prior art system of FIG. 3.

The coding scheme used by converter 48 to control correction logic 54 is shown in the coding table in FIG. 4. The four-bit coded output of the first stage A/D converter 32 is shown in column 70. The three-bit code output plus the control bit for the second stage output of converter 48 is shown in column 72. There it can be seen that a single code width of the codes in column 70 for converter 32 are equivalent to eight code widths of the codes produced by converter 48. Column 72 also indicates that there is a correction range including over-correction range 74 and under-correction range 76. Thus it can be seen that when the three-bit output code in column 72 is prefixed with a control bit of zero, converter 48 is operating in its nominal range 76. However, when the three-bit code is accompanied by a control bit of one and the most significant bit in the three output bits is zero, the system is in the over-correction range while when the control bit is a one but the first or most significant bit is a one, the system is operating in the under-correction range. Thus by means of the control bit on line 52 and the MSB on line 56, the system informs correction logic 54 of whether or not and in what direction the first converter 32 has introduced an error into the system. In the over-correction range the first stage output is incremented by one; in the under-correction range the first stage output is decremented by one.

Figure 5:
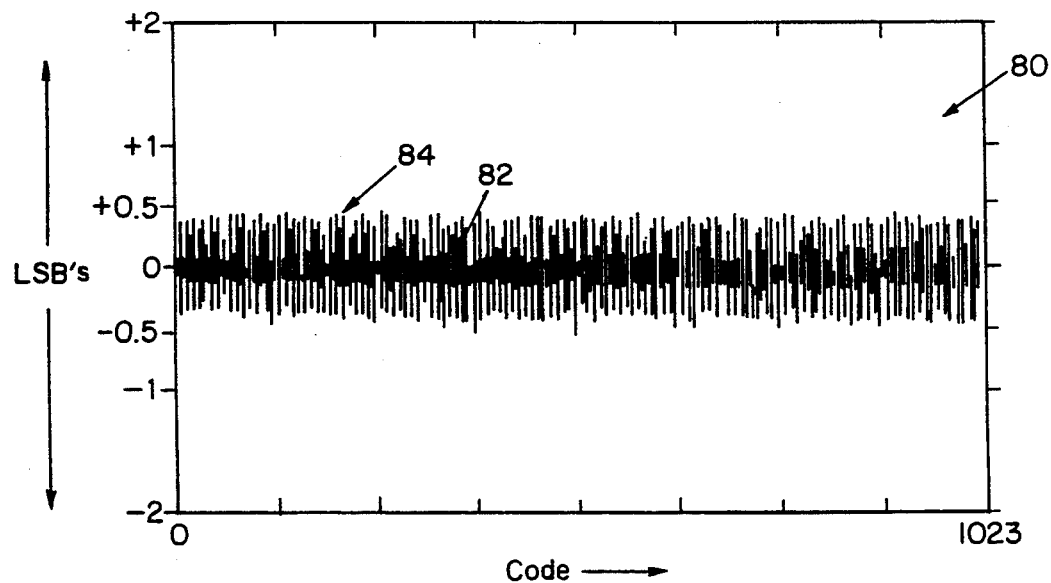
FIG. 5 is a plot of a typical differential linearity error for the system of FIG. 3 under test conditions.
Figure 6:
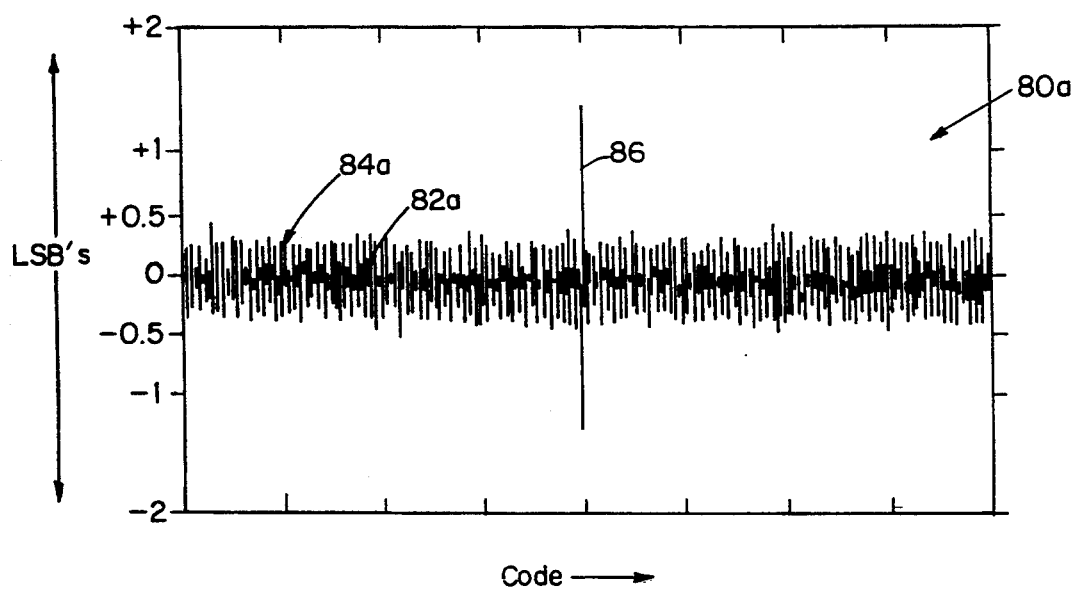
FIG. 6 is a plot of the differential linearity error for the same device as FIG. 5 for the system of FIG. 3 under operating conditions.

In such a test procedure under normal test conditions for a reliable multistage A/D converter, the plot of differential linearity error 80, FIG. 5, shows that the errors are small as most of the bits shown by the heavy black area 82 are well under 0.2 LSB and the ones that have the widest excursion 84 are well under 0.5 LSB. However, this masks the underlying problem which is that upon this same multistage A/D converter being employed in real environmental conditions where the temperature, supply voltages or other parameters may vary, one or more codes, e.g., code 86, FIG. 6, can introduce an error which is up to or greater than one whole LSB, causing a serious error in the system and a failure of the associated equipment. However, in the test procedure used with respect to FIGS. 3 and 4 such a situation is masked because there is no indication in that procedure of whether the system is in the nominal range, just over the nominal range in the correction range, or at the very extreme of the correction range.

Figure 7:
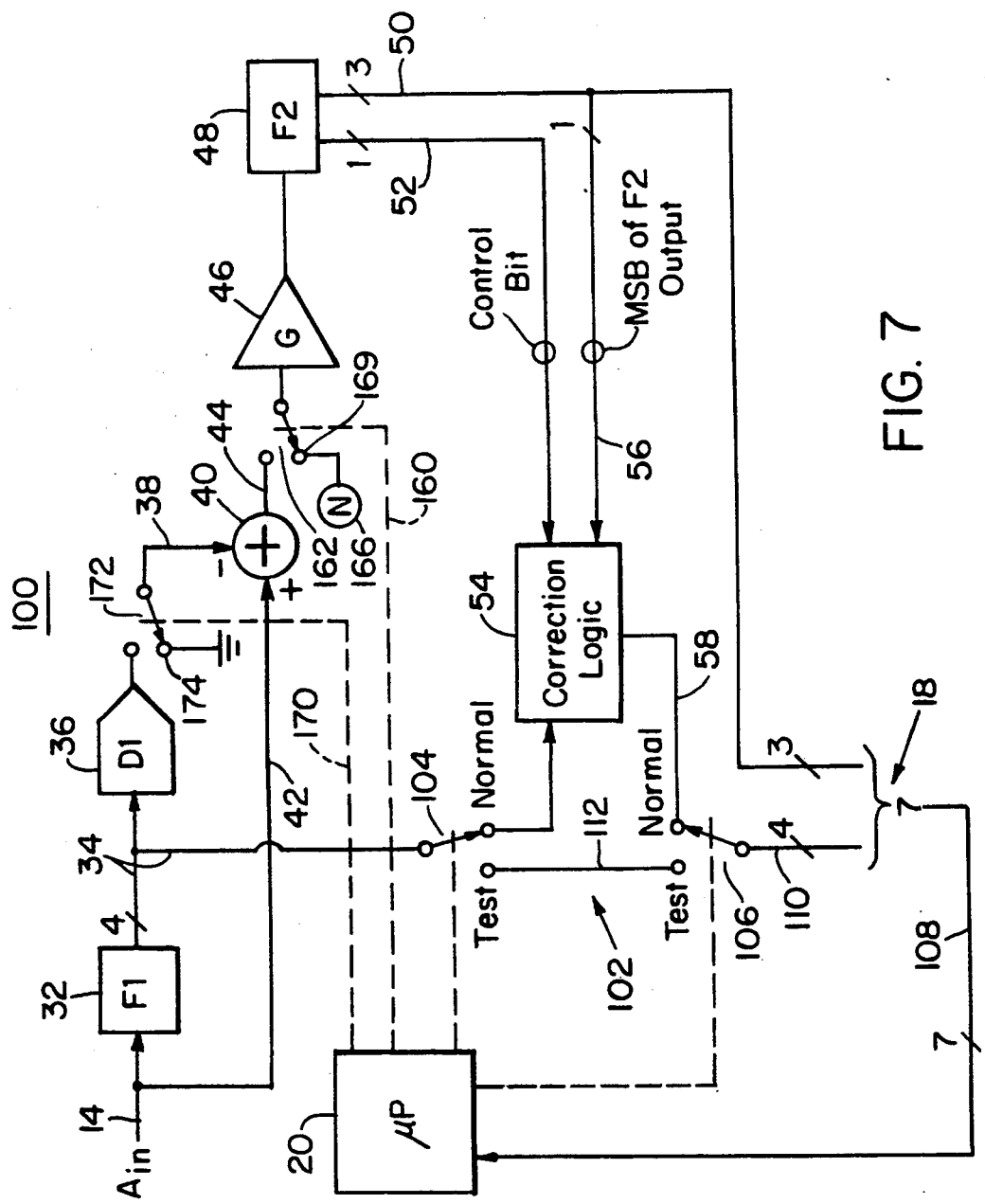
FIG. 7 is a more detailed schematic diagram of an error correction testing system for a multistage A/D converter according to this invention.

This problem is addressed in this invention by the error correction testing system for a multistage A/D converter 100, FIG. 7, which may be constructed in the same way as system 30 shown in FIG. 3, with the addition of a testing device 102 that includes two switches 104 and 106 controlled by computer 20, which receives the output of system 100 on seven-bit line 108 for analysis. In the normal mode microprocessor 20 connects the coarse digital output signal on line 104 to correction logic 54 as previously, and the output from correction logic circuit 54 on line 58 is fed through switch 106 to the four-bit line 110. However, when microprocessor 20 commands the test mode, the swinger of switch 104 connects the coarse digital output signal on line 34 to line 112, and since switch 106 is also now in the test position the signal on line 112 is connected directly to line 110. Thus in the test mode the four bits generated by first A/D converter 32 are presented at the output along with the three bits on line 50 from the second A/D converter 48 but without correction for any errors that might have driven second converter 48 into its over- or under-correction ranges 74 and 76, FIG. 4. Thus for example, if first A/D flash converter 32 is actually operating at the highest extreme, step 120, FIG. 4, in over-correction range 74, then without the control bits on line 52 and the efforts of correction logic 54, the system actually creates bits identical to those at 122, which is in the nominal range, so the output of the system appears to drop from what it should be until the input to the second flash connector is in the nominal stage 76 once again. At that point the output will once again appear normal. Basically, the first four bits are only correct in the overrange if the correction logic is engaged. These excursions from the normal track of the output are an indication that the second converter 48 is operating in a correction range, and the extent or length of these excursions indicates how far into the correction range the second A/D converter 48 is actually operating.

Figure 8:
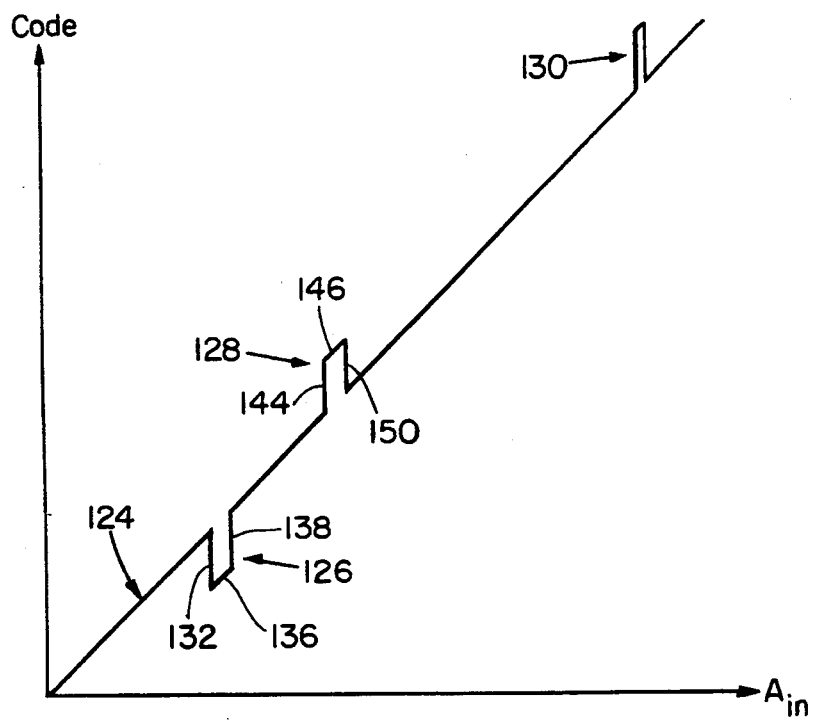
FIG. 8 is a graphical illustration of the combined output characteristics of the system of FIG. 7 showing the defects of the first A/D converter stages.

This is shown more clearly in FIG. 8, where the code out on line 108 has been plotted against the analog input in on line 14. The straight sloping ramp line 124 represents the output in the normal mode when correction logic 154 is functioning to permit second A/D converter 48 to correct for errors in the first A/D converter 32. However, when operating in the test mode that same straight line characteristic 124 may have one or more deviations as indicated at 126, 128 and 130, caused by the fact that second converter 48 is operating in a correction range. For example, when the analog input is increased to the point that it enters the correction range 72, the last three bits become zero. But since the correction logic is not functioning, the MSB codes are not incremented and the codes appear to drop. The LSBs continue to count up through the correction range until the first A/D converter 32 catches up and steps from its current step 138 to the next higher step 140, the output switches from the ramp 136 at 138 back to the main ramp 124. Thus deviation 126 indicates operation in a correction range.

Its direction, up or down, in characteristic 124 indicates whether it is in the over-74 or under-76 correction range, and the distance between 132 and 138 or the length of line 136 indicates how far into the correction range it is operating. The longer line 136, the deeper into the correction range converter 48 is operating. When operating in the under-correction range 76, indications such as deviations 128 and 130 occur. At that point ramp 146 ends and the output returns on line 150 to ramp 124. The fact that deviation 128 is above the line indicates that A/D converter 48 has been operating in the under-correction range 76 and the length of ramp 146 indicates how far into that correction range it has been operating. For example, deviation 130 being much thinner than deviation 128 indicates a much shallower excursion into under-correction range 76. For example, it may only be operating at step 152. Thus by exposing and monitoring the naked code transitions of first converter 32 relative to the code transitions of second converter 48, without the operation of the correction function of second converter 48, the true error contribution of first converter 32 not only can be detected, but the portion of the correction range over or under, and the extent of its excursion into that range, can be determined.

It is often desirable to extend the testing procedure in such multistage A/D converter systems to determine whether their full over- and under-correction ranges are operative. That is, in the fabrication process a fault may have occurred which shortens or somehow interfaces with these correction ranges. This can be tested in a number of ways. For example, microprocessor 20, using a command on line 160, may operate a switching device 162 which switches the input to amplifier 46 from the output of summer 40 to a terminal 164 of waveform generator 166 that sweeps the input to well beyond the capacity of converter 48. Alternatively, a command on line 170 from the computer or microprocessor 20 may be used to operate switch 172 so that the input on line 38 to summer 40 is disconnected from the output of digital to analog converter 36 and instead is connected to a fixed input such as ground terminal 174 so that that input to summer 40 stays steady while the analog input at 14 delivered to summer 40 sweeps through an extensive range that exceeds the capacity of the over- and under-correction ranges.

Although the multistage A/D converter with correction logic has been illustrated with only two stages, this is not a necessary limitation of the invention. The two converters, denominated first and second converter, could be any two converters for which it is desired to expose the errors introduced by the first that are normally compensated for by the second, and in fact the so-called second converter may be any one or more subsequent converters following the first converter that is under investigation.

While the encoding scheme depicted in FIG. 4 is a workable and straightforward approach, it does require two bits to determine whether the second converter 48 is operating in a correction range, and if so, which one, the over-74 or under-76, as it requires the control bit and the most significant bit of the three-bit encoding in column 72 which are delivered on line 54 and 56 to correction logic 54. It also requires logic circuitry capable of both incrementing and decrementing the MSBs. However, in another encoding scheme, shown in FIG. 9, the first stage output coding 70a is the same as in FIG. 4. However, the second stage output coding 72a has been changed by being shifted. The transition from the highest code step 180 and the lowest code step 182 are in the center of the nominal range rather than at the low end. All the control bits from step 180 down are a one, indicating that the output from first converter 32 should be decremented. In contrast, all of the control bits from step 182 up in column 72a are zero, indicating that the outputs from converter 32 should be passed on without decrement. Thus only a single line for a single control bit is required.

Figure 9:
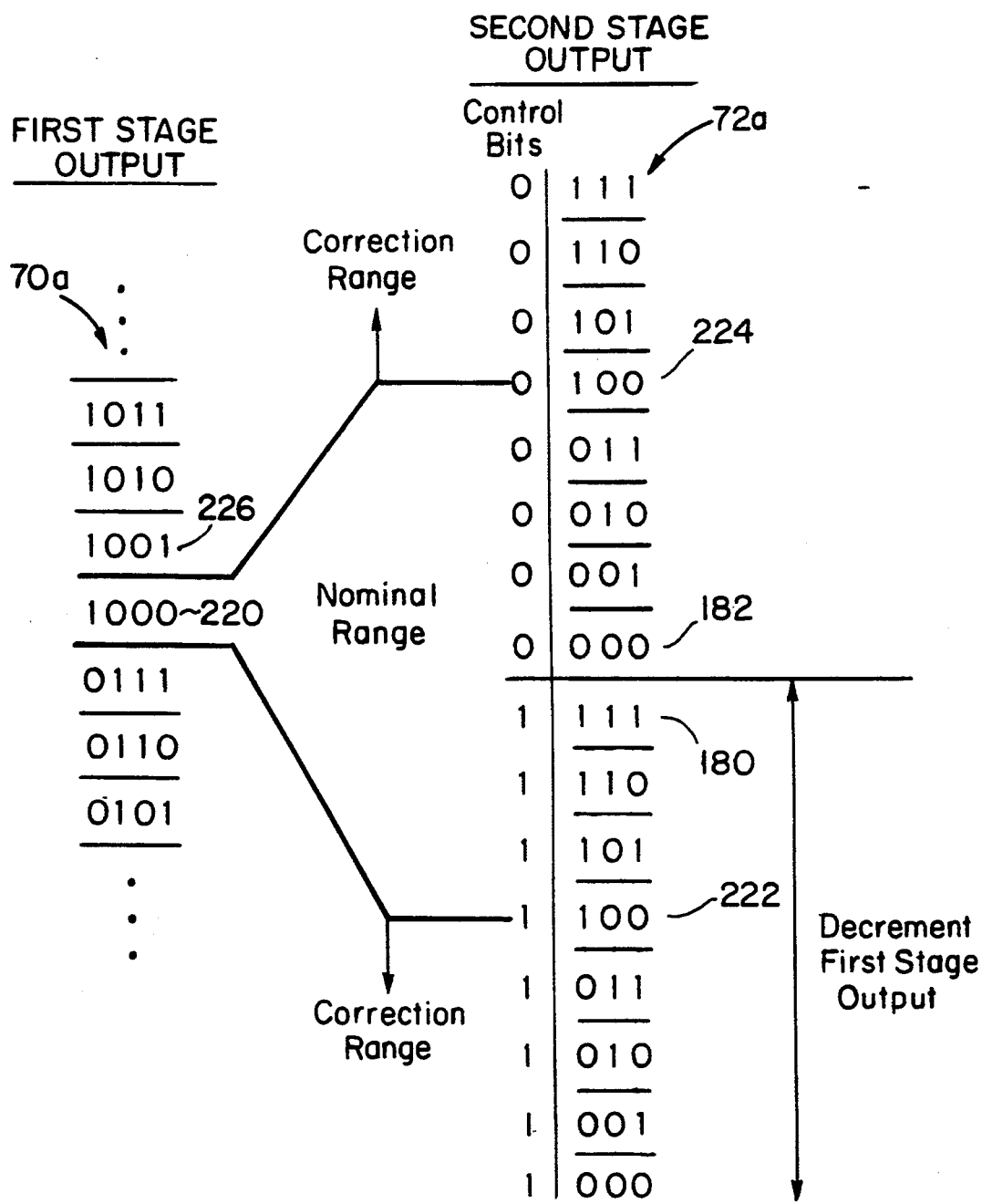
FIG. 9 is an illustration of an alternative coding scheme similar to that of FIG. 4.
Figure 10:
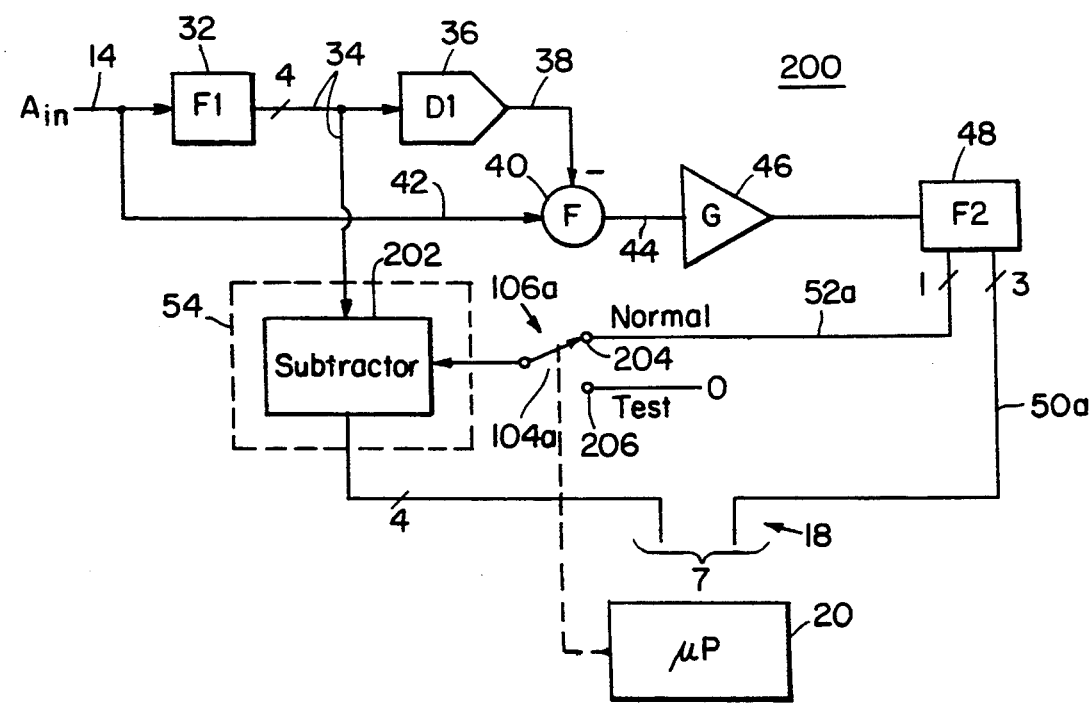
FIG. 10 is a more detailed schematic diagram of an error correction testing system for a multistage A/D converter according to this invention for using the decoding scheme of FIG. 9.

An error correction testing system 200 for a multistage A/D converter according to this invention is shown in FIG. 10 for implementing the coding system of FIG. 9. A testing device 106a includes a single switch 104a which in the normal mode connects subtractor 202 implementing correction circuit 54 to terminal 204 of line 52a to deliver the control bit to subtractor 202. The control bit will be either a one or a zero, indicating that the coarse digital output signal on line 34 from converter 32 should be decremented or should not be decremented, respectively. In the test mode switch 140 connects to terminal 206 which simply connects a steady zero to subtractor 202, preventing it from decrementing, and thereby preventing any correction by virtue of second converter 48 of errors in first converter 32.

Figure 11:
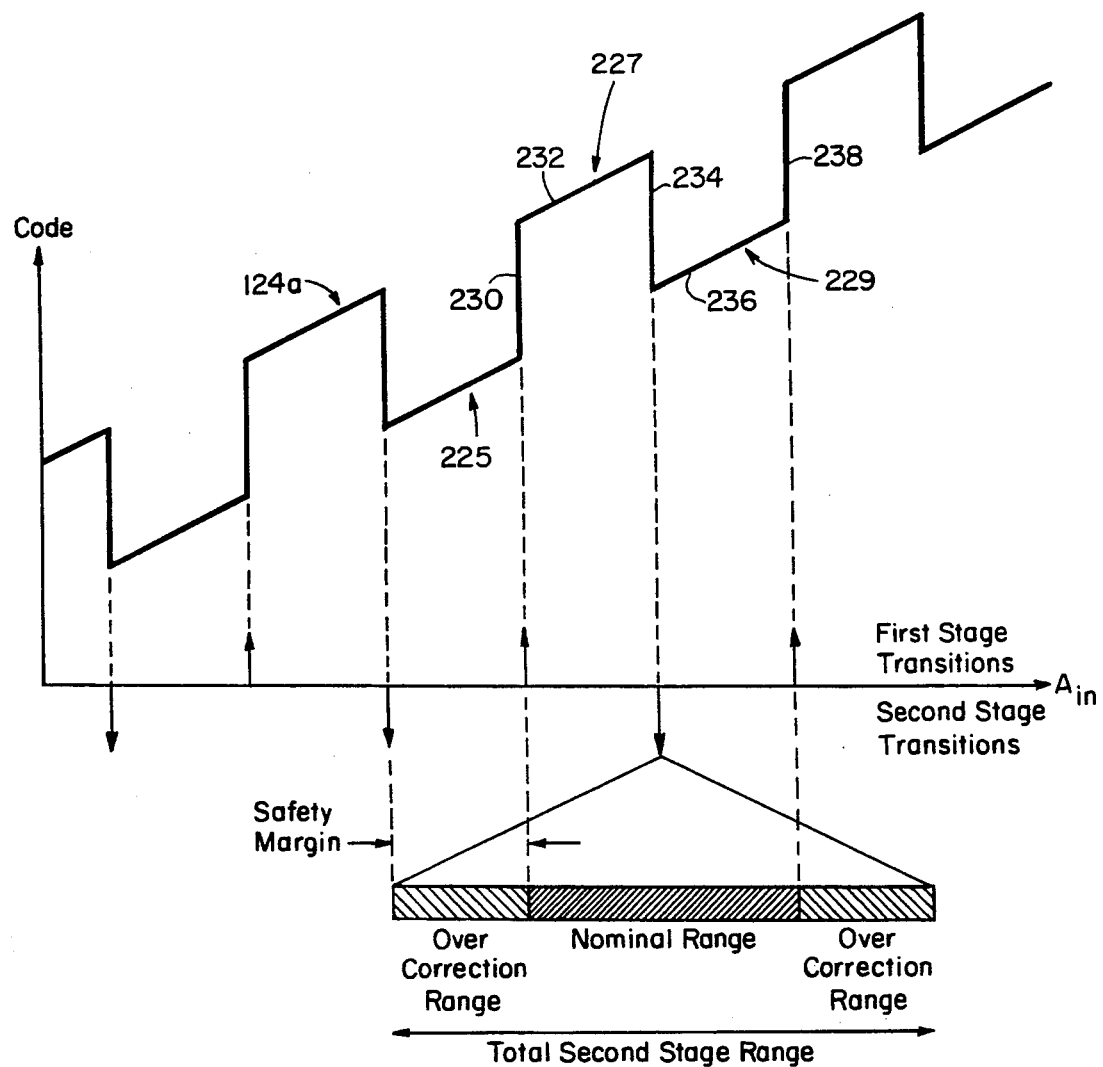
FIG. 11 is a graphical illustration of the combined output characteristic of the system of FIG. 10 showing the code transitions of the first and second A/D converter stage for an ideal A/D.

Now the coding versus analog input characteristic in test mode shown at 124 in FIG. 8 appears as at FIG. 11. It is no longer a smooth ramp but rather a square wave superimposed on a ramp 124a generated by the switching of the first stage output code 70a at the ends of the nominal range of the second stage output codes 72a and the switching of the second stage output code 72a in the middle of the first stage output code. For example, with first stage output set at the lower edge of step 220, FIG. 9, second stage output code is in the middle of its range at step 222. Subsequently, while first stage output 70a is still at step 220, second stage output 72a switches from its highest step 180 to its lowest step 182. Subsequently, when second stage output code 72a is in its mid-range at step 224, first stage output code 70a switches from code 220 to 226. This can be seen more clearly in the illustration of FIG. 11, where at the end of negative pulse 225 characteristic 124a tracks positively along line 230 (positive pulse 227) and first stage output steps to code 220, and then moves upward along ramp 232 while second stage coding counts from step 222 to step 180. As the second stage output code switches transitions from step 180 to step 182, ramp 124a descends along line 234 (negative pulse 229). Counting continues along ramp 236 until step 224 is reached in the second stage output coding, whereupon first stage output coding jumps from step 220 to 226 and characteristic 124a once again rises at 238.

When the input is in the upper half of range 72a, the coding works as in normal (non-test) mode. In the lower half of 72a, however, the decrementing action does not take place in test mode and the resulting output codes are too high. Thus as the residue repeatedly sweeps across the range of the second stage, sections of normal codes alternate with sections of "too high" codes, giving FIG. 11 its characteristic square wave appearance.

Figure 12:
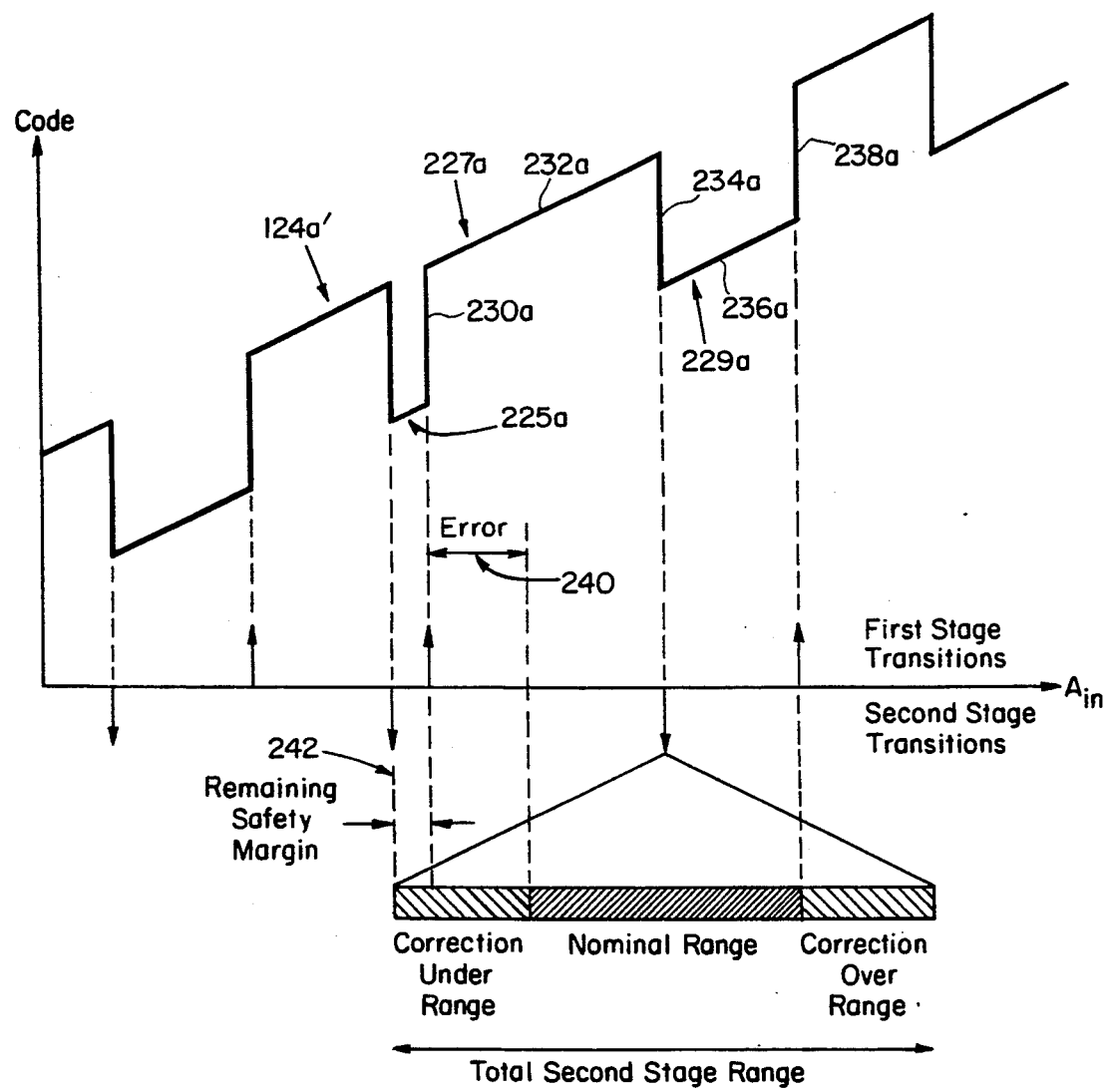
FIG. 12 is a graphic illustration of the combined output characteristic of the system of FIG. 10 showing the code transitions of the first and second A/D converter stages in the presence of a first stage defect.

Characteristic 124a, FIG. 11, represents the operation of a perfect first A/D converter 32 in conjunction with second A/D converter 48. However, if first stage output code 70a, FIG. 9, switches prematurely from step 220 to 226, characteristic 124'a, FIG. 12, detects this and exposes it because the early rise at 230a shrinks negative-going pulse 225a and enlarges positive-going pulse 227a.

The occurrence of this interruption in the symmetrical uniform nature of the characteristic 124a is an indication that the system is operating in the correction range. The width of negative pulse 227a indicates how great the error 240 is and how much safety margin 242 remains. The fact that it is a negative pulse 225a that has shrunk indicates that it is operating in the under-correction range where decrementing is normally necessary. If it were a positive-going pulse it would indicate that operation is in the over-correction range where no decrementing is necessary.

A positive going edge in FIG. 11 indicates that a first stage threshold (lines on column 70a) has been crossed. A negative going edge—bringing the output down from "too high" to "normal"—indicates that the midpoint of the second stage has been crossed. This horizontal distance between up and down edges in FIG. 12 indicates the location of first stage thresholds relative to the second stage midpoints.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An error correction testing system for a multistage A/D converter, comprising:
    a first A/D converter, responsive to an analog input signal, to provide a coarse digital output signal;
    a digital to analog converter responsive to said coarse digital output signal to provide a coarse intermediate analog output signal;
    means for subtracting said analog input signal and said coarse intermediate analog output signal to obtain a residue signal having a predetermined ideal range;
    a second A/D converter for providing a fine digital output signal and having an added range beyond its normal range for accommodating said residue signal going beyond this predetermined ideal range as a function of an error in said first A/D converter;

correction means for combining said coarse and fine digital output signals for enabling said second A/D converter to compensate, using its added range, for transition errors in the coding levels of said first A/D converter and produce a composite high resolution output signal; and testing means for disabling said correction means and indicating the code transitions of the first A/D converter relative to the code transitions of the second A/D converter representing error in the first A/D converter.

2. The error correction testing system of claim 1 in which said testing means include switching means.

3. The error correction testing system of claim 1 in which said testing means includes means for detecting the position of the code transitions of said first A/D converter.

4. The error correction testing system of claim 1 in which said testing means includes means for detecting the relative position of said code transitions of said first and second A/D converter.

5. The error correction testing system of claim 1 further including means for applying a test input to said second A/D converter for driving it at least to the end of its added range.

6. A method of testing for error correction in a multistage AD converter comprising:

submitting an analog input signal to a first A/D converter to provide a coarse digital output signal;

delivering that coarse digital output signal to a D/A converter to obtain a coarse intermediate analog output signal;

subtracting the analog input signal and coarse intermediate analog output signal to produce a residue signal having a predetermined ideal range;

submitting the residue signal to a second A/D converter which provides a fine digital output signal and has a nominal range and an added range for accommodating for the residue signal going beyond its ideal range as a function of an error in the first A/D converter;

combining the coarse and fine digital output signals in a correction circuit for enabling the second A/D converter to compensate, using its added range, for transition errors in the coding levels of the first A/D converter and producing a composite high resolution output signal; and disabling the correction circuit to indicate the code transitions of the first A/D converter relative to the code transitions of the second A/D converter representing error in the first A/D converter.

* * * * *